United States Patent [19]

Katz

[11] 4,105,970
[45] Aug. 8, 1978

[54] TEST PIN
[75] Inventor: Jonathon H. Katz, Brookline, Mass.
[73] Assignee: Teradyne, Inc., Boston, Mass.
[21] Appl. No.: 757,778
[22] Filed: Dec. 27, 1976
[51] Int. Cl.$^2$ .................. G01R 1/06; G01R 31/02; H01H 1/06
[52] U.S. Cl. .................. 324/158 P; 200/279; 324/72.5
[58] Field of Search ............ 324/158 P, 158 F, 72.5, 324/149; 339/108 TP, 275 B, 278 T; 200/275, 279

[56] References Cited

U.S. PATENT DOCUMENTS

| | | | |
|---|---|---|---|
| 3,068,403 | 12/1962 | Robinson | 324/72.5 |
| 3,996,516 | 12/1976 | Luther | 324/158 P |

*Primary Examiner*—Rudolph V. Rolinec
*Assistant Examiner*—Ernest F. Karlsen

[57] ABSTRACT

An electrical testing pin characterized by a crown with an inner contact area and a plurality of outer contact areas, the former extending longitudinally beyond the latter.

10 Claims, 3 Drawing Figures

U.S. Patent    Aug. 8, 1978    4,105,970

TEST PIN

FIELD OF THE INVENTION

This invention relates to test pins useful, for example, in testing the electrical characteristics of printed circuit boards.

BACKGROUND OF THE INVENTION

It is known in the art to test a component such as an unloaded printed circuit board ("PCB") by engaging it electrically at a plurality of points with the ends of a corresponding plurality of pins biased toward the unit being tested by a corresponding plurality of springs. Such pins have typically been characterized at their component-engaging ends by variously configured crowns, variously designed to make good electrical contact with varying sorts of portions of, for example, PCBs. A number of such crown configurations are disclosed at page 5 of an undated but thought current catalog of Ostby and Barton Company, Warwick, R.I., entitled "Test Probes". Crowns disclosed in that catalog include pointed, spherically radiused, flat, and knurled flat.

SUMMARY OF THE INVENTION

I have discovered that a pin crown with a higher inner point and a plurality of lower outer points makes for good contact, despite typical positional inaccuries, with many types of surfaces.

In preferred embodiments crowns according to the invention have other characteristics as set forth herein, and are used in pins in which added stability, electrical separation, and irregular surface compensation are provided by plastic caps as described.

DESCRIPTION OF A PREFERRED EMBODIMENT

I turn now to description of a presently preferred embodiment of the invention.

DRAWINGS

Figure 1:
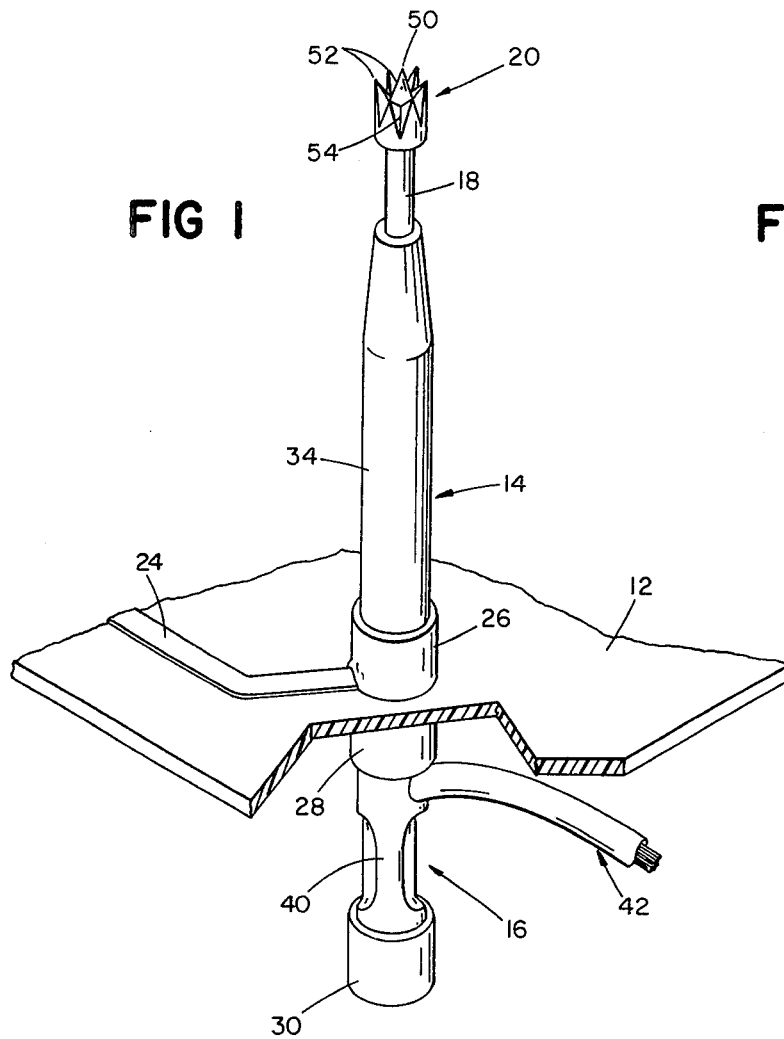
Figure 2:
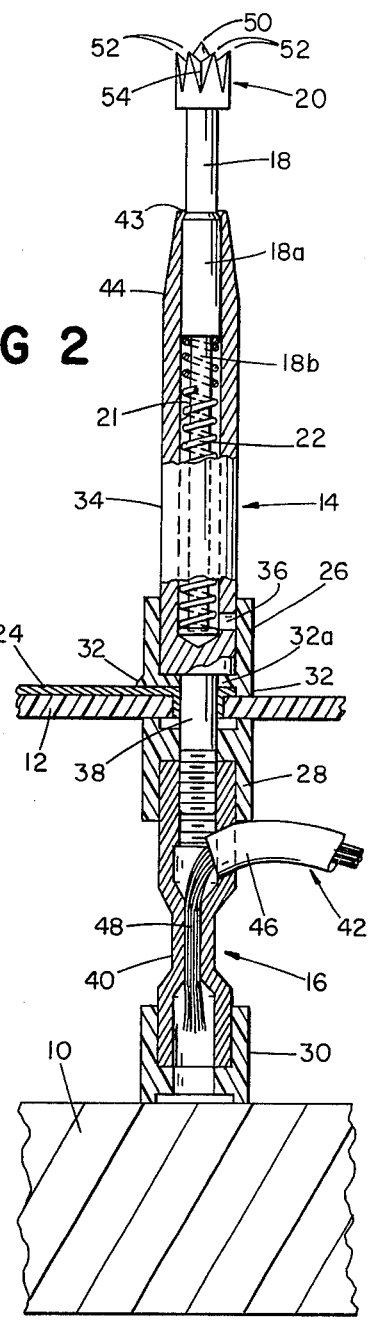
Figure 3:
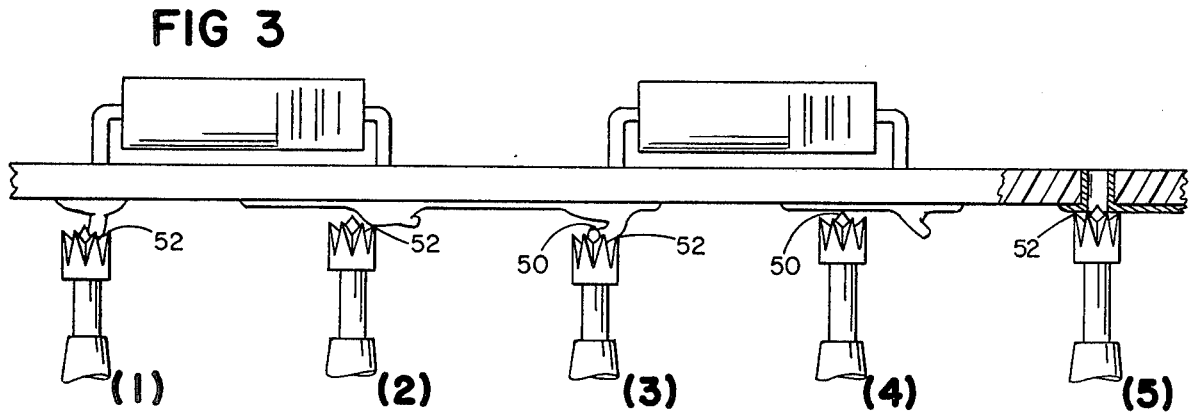

There is shown in:

FIG. 1 a perspective view of said preferred embodiment, mounted on a broken-away portion of a test fixture element comprising an otherwise unloaded PCB; in FIG. 2 a corresponding vertical sectional view, showing also a support base, partially broken away, for said pin and in FIG. 3 a multiplicity of said pins engaging a multiplicity of different sorts of PCB portions.

WRITTEN DESCRIPTION OF STRUCTURE

A test fixture (for the most part not shown) carries ½ inch thick paper phenolic baseplate 10. An otherwise unloaded PCB corresponding to a PCB to be tested carries in holes therethrough a multiplicity of test pins (only one of which is shown in FIGS. 1 and 2), each made up of upper pin assembly 14 (about six tenths of an inch in length) and lower pin assembly 16 (about four tenths of an inch long). Plunger 18 (of hardened beryllium copper, plated with chromium and then gold), with successive enlarged and reduced diameter portions 18a and 18b, respectively, and crown 20, extends into blind hole 21, almost to the bottom thereof. Stainless steel spring 22 (of wire five thousandths of an inch in diameter, and with a total of 40 turns) extends between the base of blind hole 21 and the underside of slide portion 18a (a stroke of 0.12 inches is provided).

A land 24 of the unloaded PCB element 12 is accommodated by Delrin 100 (DuPont product and trademark) cap 26 (about one tenth inch in diameter), identical to caps 28 and 30. A deformable rim 32 provides accommodation, while the central portion 32a prevents undue deformation of cap 32.

Body 34 is of beryllium copper plated with nickel and gold; hole 36 permits plating the inside. Body 34 terminates in 00-80 threaded portion 38, which threadedly engages beryllium copper (plated with nickel and gold) wireholder 40, crimped in a standard closed crimp to wire 42. The thin upper edge 43 of body 34 is rolled over enlarged portion 18a of slide 18, to upwardly restrain its longitudinal movement; tapered portion 44 of body 34 not only provides easy deformability at 43 and strength below, but cooperates with a frustoconical driving tool (not shown) for tightening and loosening pins.

Insulation 46 terminates just inside a hole entering angularly through element 40. The hole in the side of element 40 through which the end of wire insulation 46 slidingly fits provides therewith strain relief. Wire 48 is 24 gauge (19 strands of #38 wire).

Crown 20 has seven contact areas. The first is provided by the pointed tip of central cone 50; this conically pointed tip extends longitudinally beyond the other six contact surfaces 52 forming a contact set, each of which is a linear edge defined by a pair of intersecting planar surfaces and having a lower extremity coincident with the lower periphery of cone 50. This configuration is manufactured on ordinary screw machine equipment, first forming an annular groove defined by a pair of conical surfaces that defining conical portion 50, and that the locus (frustoconical) of lines-to-be 52. Six notches 54 are then formed, the top of each notch coincident with the bottom of said annular groove.

OPERATION

Using an unloaded PCB of the type desired to be (whether or not loaded) tested, pins of the invention are installed at holes already present (and others especially drilled if desired) as desired, threading the threaded ends of portions 38 of bodies 34 to wireholders 40. The tool already mentioned, with a frustoconical portion mating with body frustoconical portion 44, is useful in this connection. So too, often, when a tendency of lower pin assembly 16 to turn manifests itself, is a simple tool with a chisel point with an edge about .045 inches wide, which is inserted through the hole in cap 30 (not then resting on the baseplate 10) and inserted into lower portions of the crimp 40 and the end of the wire 48, and held to prevent the lower pin assembly from turning.

The crown permits good electrical contact with many types of PCB portion, even when alignment is less than perfect. Thus, in FIG. 3 five pins according to the invention are shown engaging five different such portions, from left to right respectively: (1) a downwardly extending portion round in horizontal crosssection (and engaged in said valley, with two sharp edges 52 biting into it); (2) a blob of solder (engaged by one sharp edge 52 in such a way as to avoid the tendency to bend the pin that would exist had a lower portion of a central cone engaged it); (3) a bent-over wire portion (engaged by two edges 52 and the side of central portion 50); (4) a land (engaged by the point of cone 50); and (5) a hole (engaged therearound by the points of six edges 52, although the point of cone 50 is in it).

Caps 26, 28, and 32 not only provide broadened pin bases, to discourage tipping or bending, but provide insulation between adjacent pins in the event of physical contact therebetween.

CONCLUSION

Other embodiments within the scope of the invention will occur to those skilled in the art.

What is claimed is:

1. A test pin comprising:
a body,
a slide, and
a spring,
    said spring being carried in said body and engaging said slide to yieldingly bias said slide away from said spring, and
    said slide terminating away from said spring in a crown formed from an integral body of conductive material,
    said crown including a multiplicity of spaced sharp contacts,
    said multiplicity of spaced sharp contacts including a central sharp contact and a multiplicity of sharp contacts spaced therearound in a contact set, each contact of said set being separated from adjacent contacts of said set by continuous radial grooves extending uninterruptedly at an angle to define two of said sharp contacts of said set and allow self-cleaning,
    said contact set being longitudinally positioned toward said spring from said central contact.

2. The pin of claim 1 in which said central sharp contact is a conical point.

3. The pin of claim 2 in which said contacts of said contact set are linear edges.

4. The pin of claim 3 in which said linear edges are defined by planes meeting at an acute angle.

5. The pin of claim 4 in which said linear edges taper radially inwardly longitudinally toward said spring.

6. The pin of claim 5 in which the lower extremity of each of said linear edges is coincident with the lower extremity of a cone having as its upper extremity said conical point.

7. The pin of claim 6 in which six said linear edges are provided.

8. The pin of claim 1 in which said body includes at its extremity toward said crown a frustoconical portion and said slide includes a portion of increased diameter, the upper edge of said frustoconical portion being crimped over the upper extremity of said portion of increased diameter.

9. The pin of claim 1 in which said body carries means for detactably engaging a wireholder.

10. The pin of claim 1 in which said pin includes at least one cap of larger diameter than said body and carried by a said body, said cap being easily deformable in use around an edge thereof only.

* * * * *